United States Patent
Otsubo et al.

(10) Patent No.: US 11,602,089 B2
(45) Date of Patent: Mar. 7, 2023

(54) HIGH-FREQUENCY MODULE

(71) Applicant: Murata Manufacturing Co., Ltd., Kyoto (JP)

(72) Inventors: Yoshihito Otsubo, Kyoto (JP); Yosuke Matsushita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 140 days.

(21) Appl. No.: 16/878,181

(22) Filed: May 19, 2020

(65) Prior Publication Data
US 2020/0281102 A1  Sep. 3, 2020

Related U.S. Application Data

(63) Continuation of application No. PCT/JP2018/042419, filed on Nov. 16, 2018.

(30) Foreign Application Priority Data

Nov. 20, 2017  (JP) .............................. JP2017-222458

(51) Int. Cl.
*H05K 9/00* (2006.01)
*H01L 23/31* (2006.01)
(Continued)

(52) U.S. Cl.
CPC ............ *H05K 9/0024* (2013.01); *H01L 23/31* (2013.01); *H01L 23/66* (2013.01); *H01L 25/18* (2013.01);
(Continued)

(58) Field of Classification Search
CPC .......... H05K 9/00; H05K 9/0015; H05K 3/28; H05K 3/284; H05K 3/185; H05K 1/02;
(Continued)

(56) References Cited

U.S. PATENT DOCUMENTS 8,247,889 B2 * 8/2012 Liao ....................... H05K 3/284
257/659
9,070,793 B2 * 6/2015 Liao ....................... H01L 23/552
(Continued)

FOREIGN PATENT DOCUMENTS

JP  H05-102689 A  4/1993
JP  2001-044305 A  2/2001
(Continued)

OTHER PUBLICATIONS

Notice of Reasons for Rejection for Japanese Patent Application No. JP2019-554303 dated Jul. 13, 2021.
(Continued)

*Primary Examiner* — Tuan T Dinh
(74) *Attorney, Agent, or Firm* — Pearne & Gordon LLP (57) ABSTRACT

In a high-frequency module provided with a shield member between components, improvement in the degree of freedom in design such as arrangement of components or the like is achieved while preventing damage to a wiring board. A high-frequency module (1a) includes a multilayer wiring board (2), a plurality of components (3a) and (3b) mounted on an upper surface (20a) of the multilayer wiring board (2), and a shield member (5) for shielding between the component (3a) and the component (3b), in which the shield member (5) is formed in a flat plate shape, with a plurality of metal pins (5a) each stacked in a thickness direction of the sealing resin layer (4) such that a length direction is made to be substantially parallel to the upper surface (20a) of the multilayer wiring board (2), and a resin molded portion (5b) for fixing the metal pins (5a).

16 Claims, 8 Drawing Sheets

(51) Int. Cl.
*H01L 23/66* (2006.01)
*H01L 25/18* (2023.01)
*H05K 1/02* (2006.01)
*H05K 3/28* (2006.01)
*H05K 3/34* (2006.01)

(52) U.S. Cl.
CPC ........... *H05K 1/0213* (2013.01); *H05K 3/284* (2013.01); *H05K 3/341* (2013.01); *H05K 2201/0715* (2013.01); *H05K 2203/107* (2013.01); *H05K 2203/1316* (2013.01)

(58) Field of Classification Search
CPC .. H05K 1/0243; H05K 1/0298; H05K 1/0213; H01L 23/12; H01L 23/31; H01L 23/66; H01L 23/552; H01L 23/3121; H01L 23/5383; H01L 23/284; H01L 21/561; H01L 25/28
USPC ................ 361/760–764, 767–784, 816, 818; 174/520; 257/685–690, 785–790
See application file for complete search history.

(56) References Cited

U.S. PATENT DOCUMENTS

| | | | | |
|---|---|---|---|---|
| 10,424,545 B2* | 9/2019 | Lin | | H01L 25/18 |
| 10,629,542 B2* | 4/2020 | Hong | | H05K 3/366 |
| 10,937,739 B2* | 3/2021 | Jun | | H01L 23/552 |
| 2006/0258050 A1 | 11/2006 | Fujiwara et al. | | |
| 2011/0304993 A1* | 12/2011 | Takemura | | H01L 23/3121 |
| | | | | 361/736 |
| 2014/0293550 A1* | 10/2014 | Mugiya | | H05K 3/284 |
| | | | | 361/728 |
| 2015/0043172 A1* | 2/2015 | Mugiya | | H05K 3/284 |
| | | | | 361/728 |
| 2016/0095267 A1 | 3/2016 | Kitazaki et al. | | |
| 2016/0120039 A1* | 4/2016 | Bang | | H05K 3/341 |
| | | | | 29/832 |
| 2016/0276288 A1* | 9/2016 | Lee | | H01L 24/97 |
| 2017/0077039 A1* | 3/2017 | Liao | | H01L 21/561 |
| 2017/0243832 A1* | 8/2017 | Hong | | H01L 21/561 |
| 2017/0301630 A1 | 10/2017 | Nguyen et al. | | |
| 2017/0354039 A1 | 12/2017 | Miwa | | |
| 2018/0092257 A1 | 3/2018 | Otsubo et al. | | |
| 2018/0130755 A1* | 5/2018 | Lee | | H01L 25/0655 |
| 2018/0211925 A1* | 7/2018 | Tsai | | H01L 21/563 |
| 2018/0240759 A1* | 8/2018 | Haji-Rahim | | H01L 23/3121 |
| 2018/0274798 A1* | 9/2018 | Jung | | F24F 13/105 |
| 2019/0393166 A1 | 12/2019 | Otsubo | | |

FOREIGN PATENT DOCUMENTS

| | | |
|---|---|---|
| JP | 2005317935 A | 11/2005 |
| JP | 2013-138147 A | 7/2013 |
| JP | 2016072411 A | 5/2016 |
| WO | 2016092893 A1 | 6/2016 |
| WO | 2016154494 A2 | 9/2016 |
| WO | 2016181954 A1 | 11/2016 |
| WO | 2018164158 A1 | 9/2018 |

OTHER PUBLICATIONS

International Search Report issued in Application No. PCT/JP2018/042419, dated Feb. 12, 2019.

Written Opinion issued in Application No. PCT/JP2018/042419, dated Feb. 12, 2019.

* cited by examiner

-- Prior Art --

HIGH-FREQUENCY MODULE

This is a continuation of International Application No. PCT/JP2018/042419 filed on Nov. 16, 2018 which claims priority from Japanese Patent Application No. 2017-222458 filed on Nov. 20, 2017. The contents of these applications are incorporated herein by reference in their entireties.

BACKGROUND OF THE DISCLOSURE

Field of the Disclosure

The present disclosure relates to a high-frequency module including a shield between components.

Description of the Related Art

Figure 14:
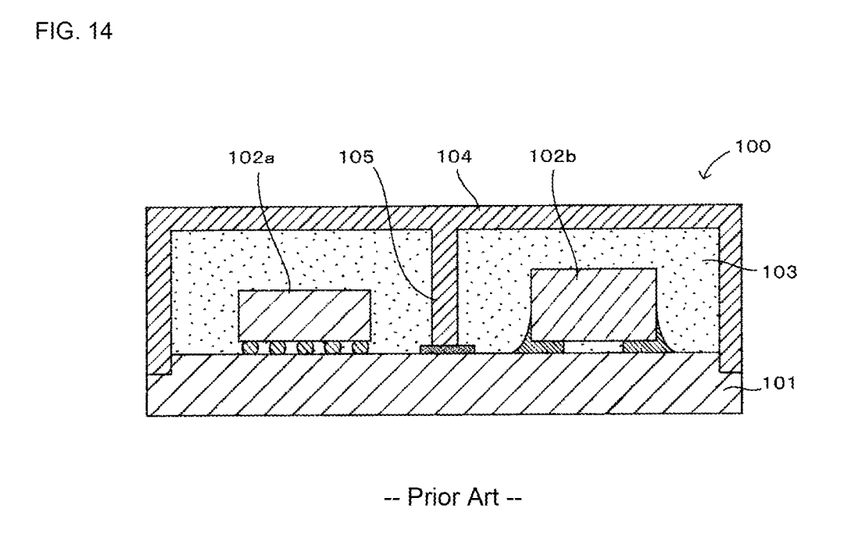
FIG. 14 is a cross-sectional view of an existing high-frequency module.

In order to prevent external noise from affecting a mounted component, some high-frequency modules mounted on a portable terminal device or the like are provided with a shield film formed on a surface of a resin layer for sealing the mounted component. In addition, when a plurality of components is mounted, in order to prevent the mutual interference by the noise radiated from the component itself, a shield is provided between components in some cases. For example, as illustrated in FIG. 14, in a high-frequency module 100 disclosed in Patent Document 1, a plurality of components 102a and 102b is mounted on an upper surface of a wiring board 101, and each of the components 102a and 102b is sealed by a sealing resin layer 103. Additionally, a surface of the sealing resin layer 103 is covered with a shield layer 104 to block unnecessary noise from the outside to the components 102a and 102b. Furthermore, a shield portion 105 is provided between the components 102a and 102b in addition to the shield layer 104, which prevents the mutual interference by the noise between the components.

Patent Document 1: Japanese Unexamined Patent Application Publication No. 2016-72411 (see paragraphs 0060 to 0062, FIG. 13, and the like)

BRIEF SUMMARY OF THE DISCLOSURE

In the existing high-frequency module 100, by forming a groove in the sealing resin layer 103 by laser processing and filling the groove with a conductive resin, the shield portion 105 is formed between the mounted components. In this case, there is a risk that the wiring board will be damaged by laser irradiation when forming the groove. Moreover, in order to protect the mounted components from impact caused by the laser, it is necessary to arrange the components at a position away from the groove, and there is thus a problem of increase in size. Furthermore, if an attempt is made to fill the groove with the conductive resin, for example, there are cases where a contrivance such as forming a cross section of the groove in a tapered shape or the like is required, and a problem that the degree of freedom in design such as component arrangement or the like is limited may also arise.

The present disclosure has been made in view of the above-described problems, and an object of the present disclosure is, in a high-frequency module including a shield member between components, to improve the degree of freedom in design such as the arrangement of the components or the like while preventing damage to a wiring board.

In order to achieve the above-described object, a high-frequency module according to the present disclosure includes: a wiring board; a first component and a second component mounted on a main surface of the wiring board; and a shield member arranged between the first component and the second component, in which the shield member includes a metal pin arranged such that a length direction is substantially parallel to the main surface of the wiring board.

According to this configuration, since the shield can be formed between the components by the metal pin, there is no risk that the wiring board is damaged when forming a shield between the components unlike the existing high-frequency module in which the shield is formed in a groove of a sealing resin layer. Furthermore, since there is also no restriction that the first component and the second component cannot be arranged near the shield member, the degree of freedom in design is improved. Additionally, since the metal pin has a higher conductivity than that of a conductive paste, it is possible to improve shield characteristics between the components. Furthermore, since the metal pin is arranged such that the length direction is substantially parallel to the main surface of the wiring board, the wiring board and the metal pin are easy to be connected to each other.

Furthermore, a plurality of the metal pins may be included, and the plurality of metal pins may include a metal pin which is arranged so as to overlap when viewed from a perpendicular direction to the main surface of the wiring board.

According to this configuration, it is possible to form a shield between the first component and the second component by stacking up the horizontally placed metal pins in a direction perpendicular to the main surface of the wiring board.

Furthermore, the plurality of metal pins may further include a plurality of metal pins each arranged, at a position overlapping with the first component when viewed from the perpendicular direction, apart from the first component.

According to this configuration, not only the shield between the first component and the second component but also the shield on the upper side of the first component can be performed with the shield member, and the shield performance for the first component can be further improved.

Furthermore, the shield member may be arranged so as to surround at least one of the first component and the second component.

According to this configuration, since the first component is surrounded by the shield member, the shield characteristics for the first component are further improved.

Furthermore, the shield member may be comprised of a first shield member arranged between the first component and the second component, and a second shield member formed so as to cover the first component.

According to this configuration, since the first component is surrounded by the shield member, the shield characteristics for the first component are improved. Furthermore, by dividing the shield member into the first shield member and the second shield member, the shield member surrounding the first component can be manufactured with ease.

Furthermore, the shield member may have a box shape, and may be arranged at a position covering the first component.

According to this configuration, since the first component is surrounded by the shield member, the shield characteristics for the first component are improved.

Furthermore, a sealing resin layer that includes a contact surface making contact with the main surface of the wiring board, an opposing surface opposing to the contact surface, and a side surface for connecting end edges of the contact surface and the opposing surface to each other and seals the first component and the second component, and a shield film for covering at least the opposing surface and the side surface of the sealing resin layer may be further included, a metal pin, among the plurality of metal pins, that is arranged at a farthest position from the main surface of the wiring board in a direction perpendicular to the main surface of the wiring board may be exposed from the opposing surface of the sealing resin layer and connected to the shield film.

According to this configuration, the shield film and the wiring board can be electrically connected to each other through the shield member. In this case, for example, in comparison with a configuration in which an end portion of a ground electrode is exposed to the side surface of the wiring board and connected to the shield film, the connection resistance can be reduced with ease, and the shield characteristics of the shield film are thus improved.

Furthermore, a sealing resin layer that includes a contact surface making contact with the main surface of the wiring board, an opposing surface opposing to the contact surface, and a side surface for connecting end edges of the contact surface and the opposing surface to each other and seals the first component and the second component, and a shield film for covering at least the opposing surface and the side surface of the sealing resin layer may be further included, the plurality of metal pins may each have an end portion exposed to the side surface of the sealing resin layer and may be connected to the shield film.

According to this configuration, the shield member can be grounded through the shield film. In this case, it is not necessary to provide an electrode for connection to the shield member in the wiring board, and the degree of freedom in design of the wiring board is improved.

Furthermore, a sealing resin layer that includes a contact surface making contact with the main surface of the wiring board, an opposing surface opposing to the contact surface, and a side surface for connecting end edges of the contact surface and the opposing surface to each other and seals one of the first component and the second component, and a shield film for covering at least the opposing surface and the side surface of the sealing resin layer may be further included.

According to this configuration, in the case where the sealing resin layer seals only one of the first component and the second component, the shield characteristics between the first component and the second component are improved by the shield member. Furthermore, since the side surface is covered with the shield member having the metal pin, the shield of the side surface can be enhanced.

Furthermore, the shield member may be formed in a plate shape by the plurality of metal pins being covered with a resin.

According to this configuration, the plurality of metal pins can be mounted on the wiring board at once, which is efficient. Additionally, it becomes also easy to stack up the horizontally placed plurality of metal pins.

According to the present disclosure, since a shield provided between components can be formed of a metal pin, there is no risk that a wiring board is damaged when forming a shield between components unlike the existing high-frequency module in which a shield between components is formed in a groove of a sealing resin layer. Furthermore, since restriction that the first component and the second component cannot be arranged near the shield member between the components is eliminated, the degree of freedom in design is improved. Additionally, since the metal pin has a higher conductivity than that of a conductive paste, it is possible to improve shield characteristics between the components. Furthermore, since the metal pin is arranged such that the length direction is substantially parallel to the main surface of the wiring board, the wiring board and the metal pin are easy to be connected to each other.

DETAILED DESCRIPTION OF THE DISCLOSURE

First Embodiment

A high-frequency module 1a according to a first embodiment of the present disclosure will be described with reference to FIG. 1 to FIG. 3C. Note that FIG. 1 is a cross-sectional view taken along a line A-A in FIG. 2 when viewed in the arrow direction, FIG. 2 is a plan view of the high-frequency module 1a in a state in which a sealing resin layer and a shield film 6 are removed, and each of FIGS. 3A, 3B and 3C is a diagram for explaining a shield member 5.

Figure 1:
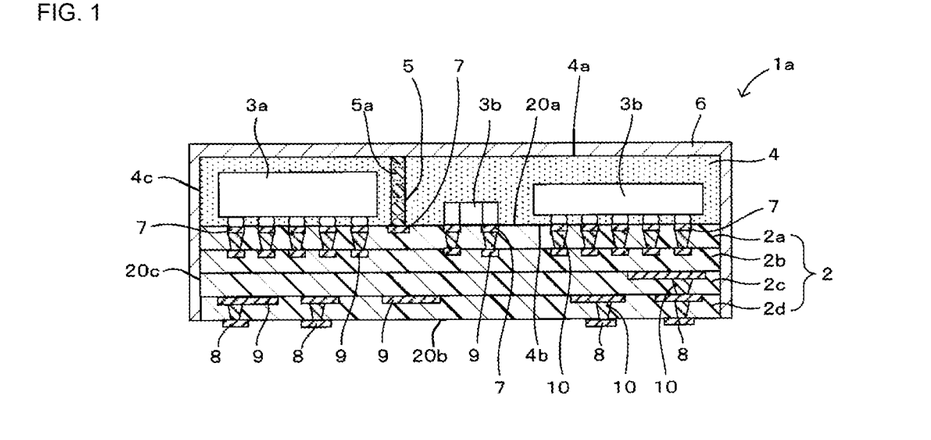
FIG. 1 is a cross-sectional view of a high-frequency module according to a first embodiment of the present disclosure.
Figure 2:
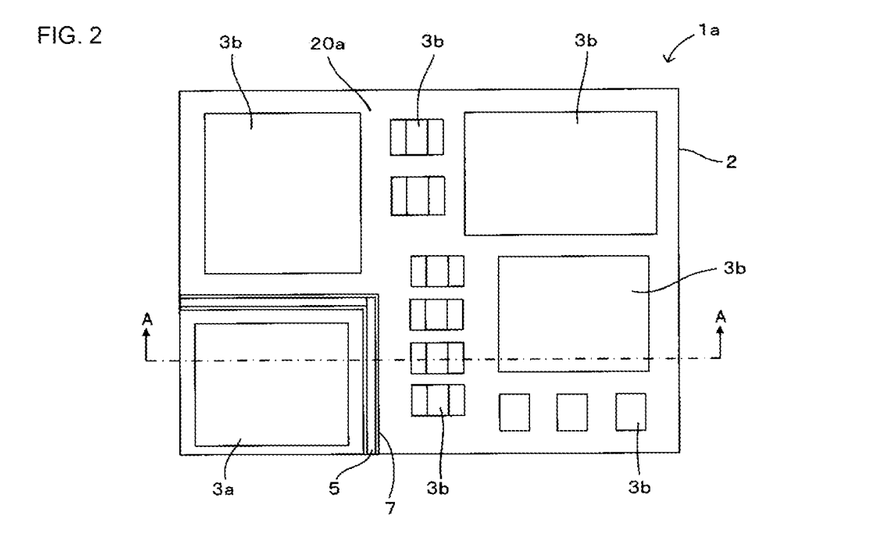
FIG. 2 is a plan view of the high-frequency module illustrated in FIG. 1 in a state in which a sealing resin layer and a shield film are removed.
Figure 3A:
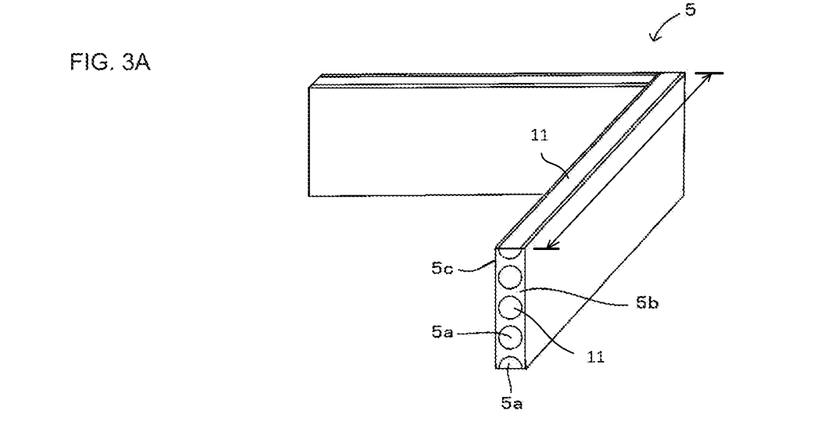
FIGS. 3A, 3B and 3C Each of FIGS. 3A, 3B and 3C is a diagram for explaining a shield member of FIG. 1.
Figure 3B:
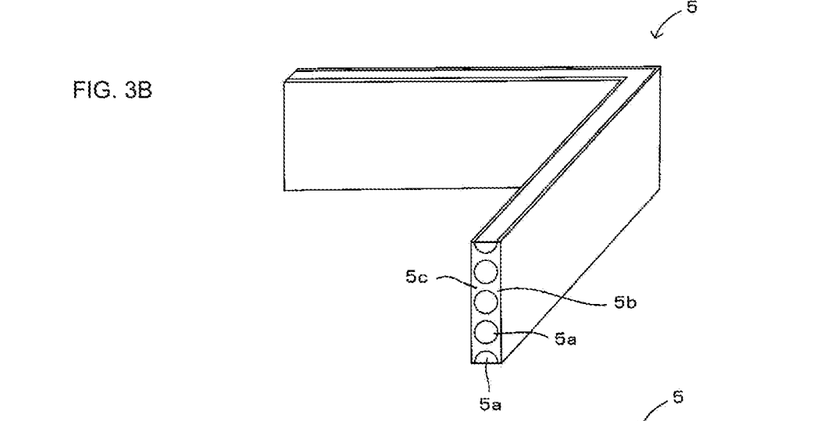
Figure 3C:
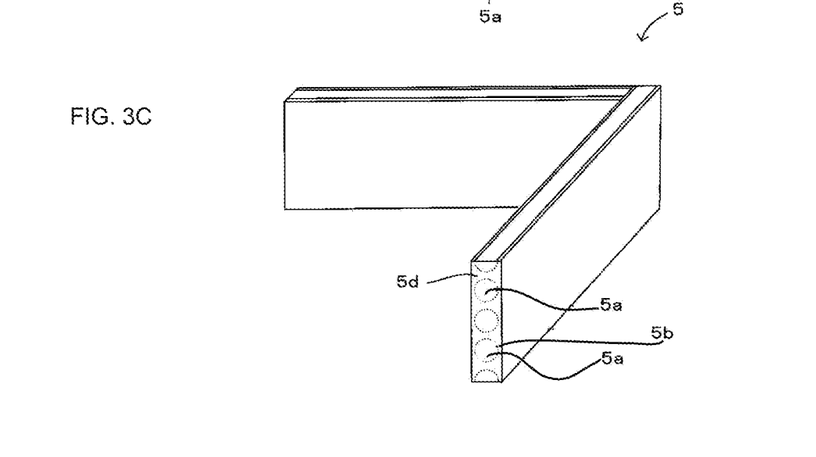

As illustrated in FIG. 1 and FIG. 2, the high-frequency module 1a according to this embodiment includes a multilayer wiring board 2 (corresponding to "a wiring board" of the present disclosure), a plurality of components 3a and 3b mounted on an upper surface 20a of the multilayer wiring board 2, a sealing resin layer 4 laminated on the upper surface 20a of the multilayer wiring board 2, the shield film 6 covering a surface of the sealing resin layer 4, and the shield member 5 mounted on the upper surface 20a of the multilayer wiring board 2, and is, for example, mounted on a motherboard or the like of an electronic apparatus for which a high-frequency signal is used.

The multilayer wiring board 2 is formed by laminating a plurality of insulating layers 2a to 2d formed of, for example, low-temperature co-fired ceramics, high-temperature co-fired ceramics, a glass epoxy resin, or the like. On the upper surface 20a of the multilayer wiring board 2 (corresponding to "a main surface of a wiring board" of the present disclosure), mounting electrodes 7 for mounting the components 3a and 3b and the shield member 5 are formed. On a lower surface 20b of the multilayer wiring board 2, a plurality of outer electrodes 8 for external connection is formed.

Furthermore, various inner wiring electrodes 9 are formed between adjacent layers among the insulating layers 2a to 2d, and a plurality of via conductors 10 for connecting the inner wiring electrodes 9 to each other formed in different insulating layers 2a to 2d is formed inside the multilayer wiring board 2. The mounting electrode 7 connected to the shield member 5 is connected to a ground electrode (inner wiring electrode 9) formed on the multilayer wiring board 2, whereby the shield member 5 is grounded.

The mounting electrodes 7, the outer electrodes 8, and the inner wiring electrodes 9 are each formed of a metal commonly used as a wiring electrode, such as Cu, Ag, Al, or the like. Furthermore, each of the via conductors 10 is made of a metal such as Ag, Cu, or the like. Note that Ni/Au plating may be applied to each of the mounting electrodes 7 and each of the outer electrodes 8.

The components 3a and 3b are comprised of a semiconductor element such as an IC, a PA (power amplifier), or the like and a chip component such as a chip inductor, a chip capacitor, a chip resistor, or the like, and are mounted on the multilayer wiring board 2 by a common surface mount technology such as solder bonding or the like.

The sealing resin layer 4 is formed of a resin commonly used as a sealing resin, such as an epoxy resin or the like, and seals each of the components 3a and 3b and the shield member 5. Furthermore, the sealing resin layer 4 includes a lower surface 4b (corresponding to "a contact surface of a sealing resin layer" of the present disclosure) making contact with the multilayer wiring board 2, an upper surface 4a (corresponding to "an opposing surface of a sealing resin layer" of the present disclosure) opposing to the lower surface 4b, and a side surface 4c.

The shield member 5 is a member for shielding between the component 3a and the component 3b, and is comprised of a plurality of metal pins 5a and a resin molded portion 5b (see FIGS. 3A, 3B and 3C). As illustrated in FIG. 2, the shield member 5 is formed in an L-shape when viewed from a direction perpendicular to the upper surface 20a of the multilayer wiring board 2, and is arranged such that the shield film 6 and the shield member 5 surround the component 3a. Specifically, as illustrated in FIG. 3A, the shield member 5 is formed of two flat plates, and both of the flat plates are arranged such that the end portions thereof are brought into contact with each other to form the L-shape. Then, by being mounted on the upper surface 20a of the multilayer wiring board 2 in a state that one main surface of each flat plate stands so as to face the component 3a, the shield member 5 is formed.

These flat plates are each comprised of the plurality of metal pins 5a and the resin molded portion 5b. At this time, the metal pins 5a forming one flat plate each comprises an elongated body 11 and are each formed to have substantially the same predominant length 1 and a straight line shape. Furthermore, the metal pins 5a are each arranged such that the length direction (i.e., the predominantly elongated direction of the elongated body 11) is parallel to the upper surface 20a of the multilayer wiring board 2, and are arranged such that all the metal pins 5a are overlapped with one another when viewed from a direction perpendicular to the upper surface 20a of the multilayer wiring board 2 in a mounted state. That is, the metal pins 5a are fixed by the resin molded portion 5b in a state of being stacked up from the upper surface 20a of the multilayer wiring board 2 toward the upper surface 4a of the sealing resin layer 4, in a horizontally placed state. Furthermore, the metal pin 5a (metal pin 5a closest to the multilayer wiring board 2) is exposed from a lower end surface of each flat plate, and is connected to the mounting electrode 7 of the multilayer wiring board 2 by solder or the like. Furthermore, the metal pin 5a (metal pin 5a farthest from the multilayer wiring board 2) is exposed from an upper end surface of each flat plate, and is connected to the shield film 6. Note that the resin molded portion 5b can be formed of a thermoplastic resin or a thermosetting resin.

Furthermore, as illustrated in FIG. 3A, from end surfaces 5c on both ends of the L shape formed by the shield member 5, end surfaces of the respective metal pins 5a are exposed. Moreover, the end surfaces 5c are each exposed from the side surface 4c of the sealing resin layer 4, and the end surfaces of the metal pins 5a and the shield film 6 are connected. These flat plates are formed, for example, by embedding the metal pins 5a in the resin in a state of being arrayed and cutting the end portion, or the like.

Note that the shield member 5 is not required to be divided into two flat plates, and may be formed of one member, for example, as illustrated in FIG. 3B. In this case, the metal pins 5a may each be bent into an L-shape and may be integrated by the resin molded portion 5b.

Furthermore, as illustrated in FIG. 3C, by applying metal plating, sticking a metal plate, or the like to the end surface 5c of the shield member 5, a conductor surface 5d may be formed over the entire surface. With this configuration, all the metal pins 5a can be grounded only by connecting the mounting electrode 7 for mounting the shield member 5 to the ground electrode. Furthermore, in this case, the shield film 6 can be grounded through the shield member 5 without being connected to the ground electrode exposed from a side surface 20c of the multilayer wiring board 2.

Each metal pin 5a can be formed by performing a shearing process on a wire material made of a metal material commonly used as a wiring electrode, such as Cu, Au, Ag, Al, a Cu-based alloy, or the like, and forming in a predetermined length, or the like. Note that when a frequency of a use signal is taken as $\lambda$, it is preferable that all intervals between the metal pins 5a be equal to or less than $\frac{1}{4}\lambda$. With this configuration, the shield characteristics by the shield member 5 are improved.

The shield film 6 covers the surface (upper surface 4a and side surface 4c) of the sealing resin layer 4 and the side surface 20c of the multilayer wiring board 2. In addition, at the upper surface 4a of the sealing resin layer 4, the metal pin 5a exposed to the upper end surface of the shield member 5 and the shield film 6 are in contact with each other. The shield film 6 is connected to a ground electrode (not illustrated) exposed to the side surface 20c of the multilayer wiring board 2.

The shield film 6 can be formed in a multilayer structure including a close-contact film laminated on the upper surface 4a of the sealing resin layer 4, a conductive film laminated on the close-contact film, and a protective film laminated on the conductive film. Here, the close-contact film is provided to increase the close contact strength between the conductive film and the sealing resin layer 4, and can be formed of, for example, a metal such as SUS or the like. The conductive film is a layer responsible for a substantial shield function of the shield film 6, and can be formed of, for example, any metal of Cu, Ag, and Al. The protective film is provided to prevent the corrosion or damage of the conductive film, and can be formed of, for example, SUS. Note that since the shield film 6 is in contact with the shield member 5 which is grounded, when the shield member 5 is grounded, it is not absolutely necessary to expose the ground electrode to the side surface 20c of the multilayer wiring board 2 and to perform the connection to the ground electrode.

Therefore, according to the embodiment described above, since the shield member 5 can be formed by the metal pin 5a and the resin molded portion 5b, there is no risk that the wiring board is damaged when forming a shield between the components unlike the existing high-frequency module in which the shield is formed in a groove of a sealing resin layer. Furthermore, since it is not necessary to form the groove by laser processing in the sealing resin layer as in the prior art, the restriction that the components 3a and 3b cannot be arranged in the vicinity of the shield member 5 is eliminated, and the degree of freedom in design is improved. Additionally, since each of the metal pins 5a has a higher conductivity than that of a conductive paste, it is possible to improve the shield characteristics of the shield member 5. Furthermore, since each of the metal pins 5a is arranged such that the length direction is substantially parallel to the upper surface 20a of the multilayer wiring board 2, the multilayer wiring board 2 and the metal pin 5a are easy to be connected to each other.

Furthermore, the shield film 6 and the ground electrode (inner wiring electrode 9) of the multilayer wiring board 2 can be electrically connected to each other through the shield member 5. In this case, for example, in comparison with a configuration in which the end portion of the ground electrode is exposed to the side surface of the multilayer wiring board and connected to the shield film, the connection resistance can be reduced with ease, and the shield characteristics of the shield film 6 are thus improved.

Furthermore, by forming the shield member 5 by the plurality of metal pins 5a and the resin molded portion 5b, it is possible to easily maintain a state in which the metal pins 5a are arrayed. That is, it is easy to perform mounting on the multilayer wiring board 2 in a state in which the horizontally placed metal pins 5a are stacked up.

(Modification of High-Frequency Module 1a)

Figure 4A:
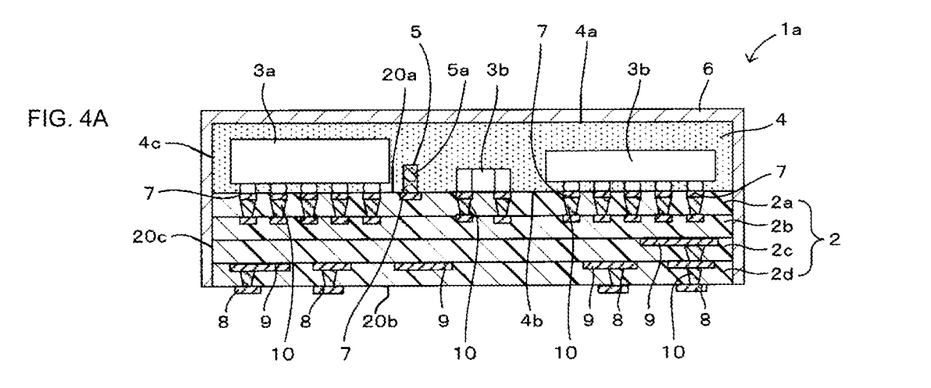
FIGS. 4A and 4B Each of FIGS. 4A and 4B is a diagram illustrating a modification of the high-frequency module illustrated in FIG. 1.

In the above-described embodiment, the formation is made such that the end portion (upper end portion) of the shield member 5 in the thickness direction of the sealing resin layer 4 is exposed from the upper surface 4a of the sealing resin layer 4, but for example, as illustrated in FIG. 4A, the configuration may be such that the shield member 5 has the height in the thickness direction of the sealing resin layer 4 less than the thickness of the sealing resin layer 4, and is embedded in the sealing resin layer 4. In this case, since each metal pin 5a of the shield member 5 is grounded through the contact with the shield film 6, the shield member 5 can be made to function as a shield. In this case, the number of metal pins may be one. Furthermore, the metal pin may be slightly bent instead of having a straight shape.

Figure 4B:
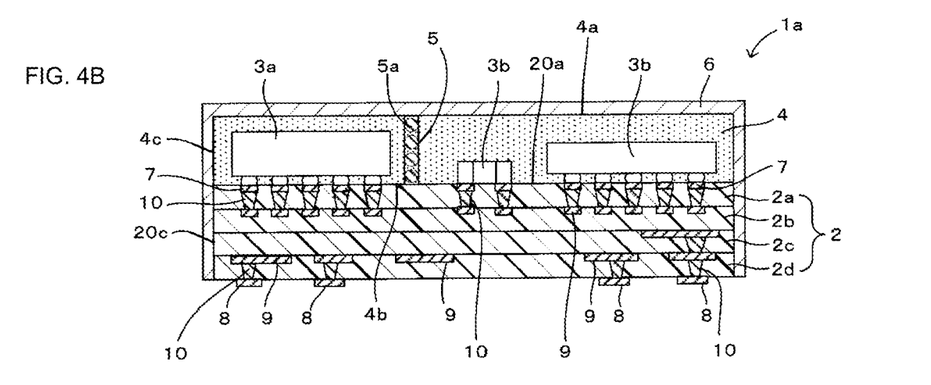

Furthermore, as illustrated in FIG. 4B, without providing the mounting electrode 7 of the multilayer wiring board 2 for the shield member 5, the shield member 5 may be fixed to the multilayer wiring board 2 with an adhesive or the like. In this configuration as well, since each metal pin 5a of the shield member 5 is grounded through the contact with the shield film 6, the shield member 5 can be made to function as a shield. Furthermore, since the mounting electrode 7 of the multilayer wiring board 2 for the shield member 5 is not provided, the degree of freedom in design of the wiring of the multilayer wiring board 2 is improved.

Second Embodiment

A high-frequency module 1b according to a second embodiment of the present disclosure will be described with reference to FIG. 5 and FIG. 6. Note that FIG. 5 is a cross-sectional view of the high-frequency module 1b, that is, the cross-sectional view taken along a line B-B in FIG. 6 when viewed in the arrow direction, and FIG. 6 is a plan view of the high-frequency module 1b in a state in which the sealing resin layer 4 and the shield film 6 are removed.

Figure 5:
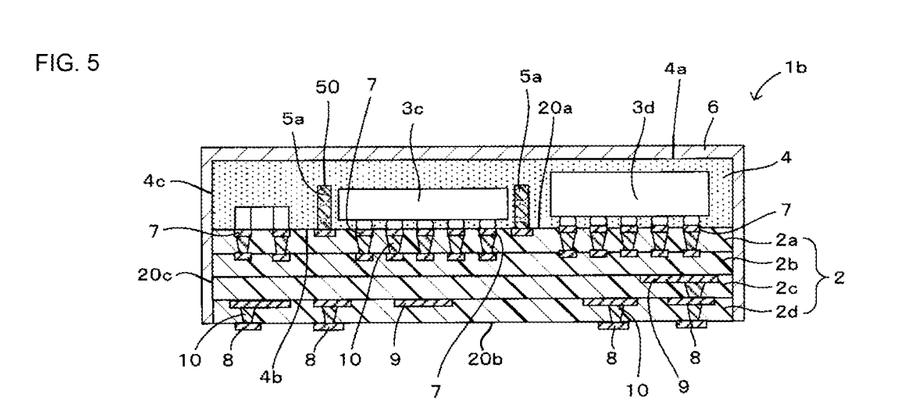
FIG. 5 is a cross-sectional view of a high-frequency module according to a second embodiment of the present disclosure.
Figure 6:
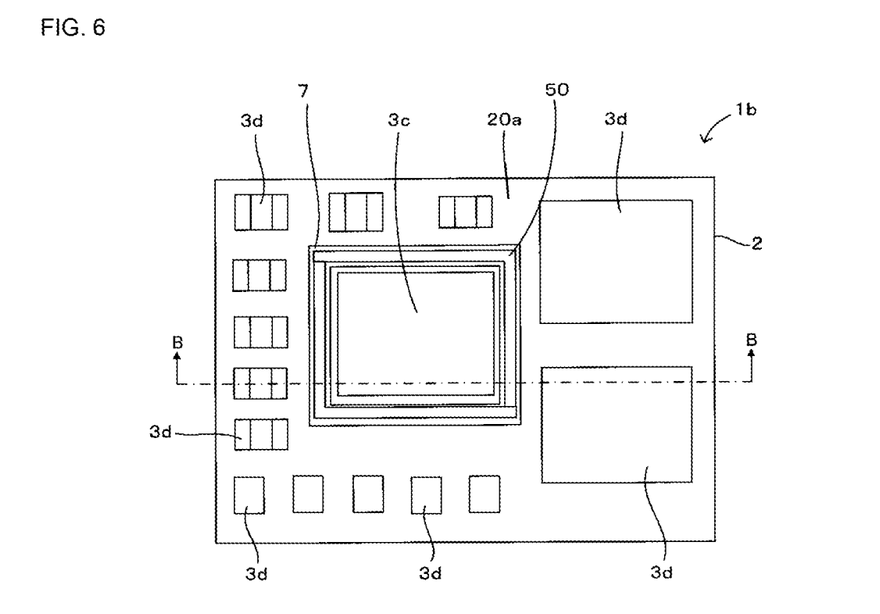
FIG. 6 is a plan view of the high-frequency module illustrated in FIG. 5 in a state in which a sealing resin layer and a shield film are removed.

The high-frequency module 1b according to this embodiment differs from the high-frequency module 1a according to the first embodiment described with reference to FIG. 1 to FIG. 3C in that a different arrangement configuration of components and a different configuration of the shield member are provided as illustrated in FIG. 5 and FIG. 6. The rest of the configuration is the same as that of the high-frequency module 1a according to the first embodiment, and the description thereof will be omitted by using the same reference numerals.

In this case, a shield member 50 is arranged so as to surround a component 3c arranged at substantially the center of the multilayer wiring board 2. For the shield member 50, for example, two members similar to the shield member 5 illustrated in FIG. 3B of the first embodiment are prepared, and when viewed from a direction perpendicular to the upper surface 20a of the multilayer wiring board 2, are mounted such that a combination thereof forms a rectangular annular shape (see FIG. 6). The component 3c is mounted in an inner side portion of the rectangular annular shape. Furthermore, the shield member 50 is formed to have a height in the thickness direction of the sealing resin layer 4 less than the thickness of the sealing resin layer 4, and is embedded in the sealing resin layer 4 (see FIG. 5). Note that the upper end of the shield member 50 may be exposed from the upper surface 4a of the sealing resin layer 4 to be connected to the shield film 6.

According to this configuration, in the configuration in which the component 3c arranged at substantially the center of the multilayer wiring board 2 is shielded, the same effects as those of the first embodiment can be obtained.

Third Embodiment

A high-frequency module 1c according to a third embodiment of the present disclosure will be described with reference to FIG. 7 and FIG. 8. Note that FIG. 7 is a cross-sectional view of the high-frequency module 1c, that is, the cross-sectional view taken along a line C-C in FIG. 8 when viewed in the arrow direction, and FIG. 8 is a plan view of the high-frequency module 1c in a state in which the sealing resin layer 4 and the shield film 6 are removed.

Figure 7:
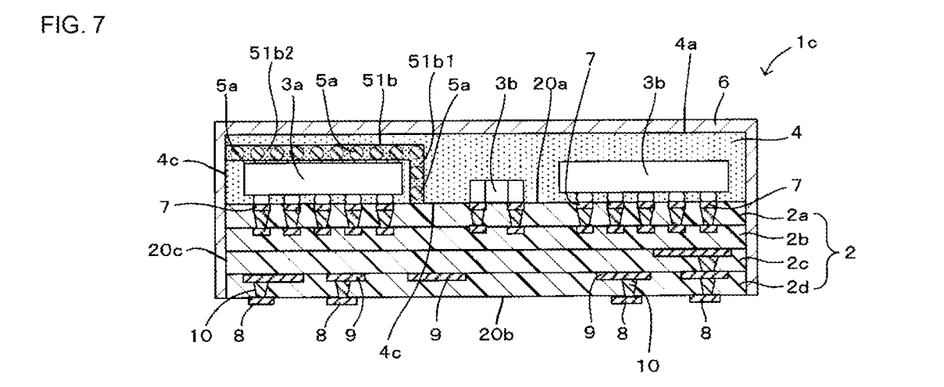
FIG. 7 is a cross-sectional view of a high-frequency module according to a third embodiment of the present disclosure.
Figure 8:
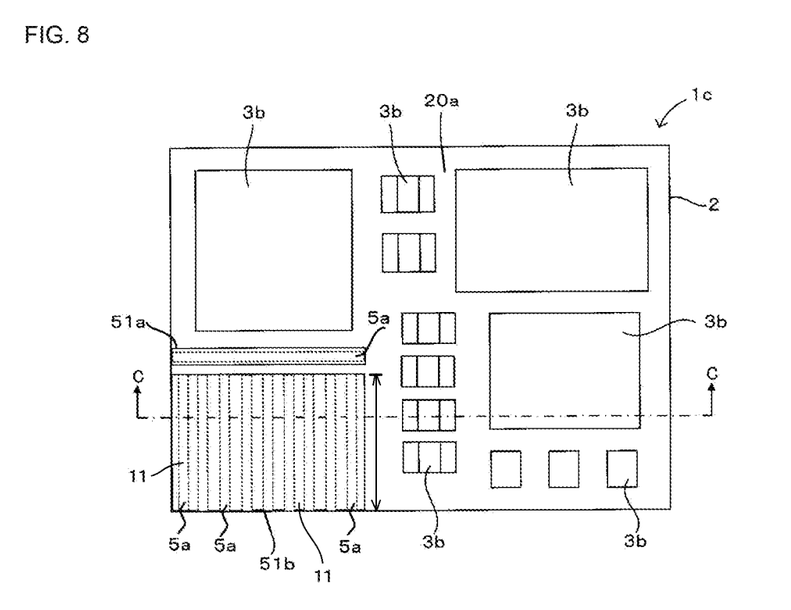
FIG. 8 is a plan view of the high-frequency module illustrated in FIG. 7 in a state in which a sealing resin layer and a shield film are removed.

The high-frequency module 1c according to this embodiment differs from the high-frequency module 1a according to the first embodiment described with reference to FIG. 1 to FIG. 3C in that the shield member has a different configuration as illustrated in FIG. 7 and FIG. 8. The rest of the configuration is the same as that of the high-frequency module 1a according to the first embodiment, and the description thereof will be omitted by using the same reference numerals.

In this case, in FIG. 8, there are provided a first shield member 51a functioning as a shield between the component 3a and the component 3b arranged on an upper side of the component 3a, and a second shield member 51b functioning as a shield between the component 3a and the component 3b arranged on the right side of this component 3a.

The first shield member 51a has the same structure as that of the one flat plate of the shield member 5 illustrated in FIG. 3A of the first embodiment. When viewed from a direction perpendicular to the upper surface 20a of the multilayer wiring board 2, the shield member is parallel to a long side of the multilayer wiring board 2 (or a long side of the component 3a) and arranged on the upper side of the component 3a. Furthermore, one end surface (corresponding to the end surface 5c in FIGS. 3A, 3B and 3C) of the first shield member 51a is exposed to the side surface 4c of the sealing resin layer 4, and the end surfaces of the respective metal pins 5a exposed to the end surface are in contact with the shield film 6.

The second shield member 51b includes a first portion 51b1 arranged between the component 3a and the component 3b on the right side of the component 3a, and a second portion 51b2 covering the upper side of the component 3a. The metal pins 5a of the first portion 51b1, each of which has the length direction parallel to a short side of the component 3a, are stacked up in one column in a direction perpendicular to the upper surface 20a of the multilayer wiring board 2 (see FIG. 7).

The second portion 51b2 is a portion extending from an upper end portion of the first portion 51b1 in a direction parallel to the upper surface 20a of the multilayer wiring board 2. Here, the respective metal pins 5a of the second portion 51b2 are arranged at positions overlapping with the component 3a when viewed from a direction perpendicular to the upper surface 20a of the multilayer wiring board 2, and are arrayed in a direction parallel to the upper surface 20a of the multilayer wiring board 2 (see FIG. 7).

Furthermore, in this example, each of the metal pins 5a of the first portion 51b1 and the second portion 51b2 similarly comprises an elongated body 11 and has substantially the same predominant length 1. Furthermore, the respective metal pins 5a of the first portion 51b1 are arranged such that the length directions (i.e., the predominantly elongated directions of the elongated bodies 11) thereof are parallel to one another. The respective metal pins 5a of the second portion 51b2 are also arranged such that the length directions (i.e., the predominantly elongated directions of the elongated bodies 11) thereof are parallel to one another. Furthermore, one end surface of the second shield member 51b is exposed from the side surface 4c of the sealing resin layer 4, and in contact with the shield film 6. Note that the second shield member 51b can be formed, for example, by forming a plate-like member in which the respective metal pins 5a are arrayed in parallel at predetermined intervals, and bending it at a boundary position between the first portion 51b1 and the second portion 51b2. At this time, a fold line may be provided in parallel to the length direction of the metal pin 5a.

Furthermore, each of the first shield member 51a and the second shield member 51b is formed to have a height in the thickness direction of the sealing resin layer 4 less than the thickness of the sealing resin layer 4, and is embedded in the sealing resin layer 4. Note that an upper end portion of each of the first shield member 51a and the second shield member 51b may be exposed from the upper surface 4a of the sealing resin layer 4 to be in contact with the shield film 6.

According to this configuration, since the upper side of the component 3a is also covered by the second portion 51b2 of the second shield member 51b, the shield characteristics for the component 3a are further improved in addition to the effects of the first embodiment. Furthermore, by dividing into the first shield member 51a and the second shield member 51b, the shield member surrounding the component 3a can be manufactured with ease.

(Modification of Second Shield Member 51b)

Figure 9:
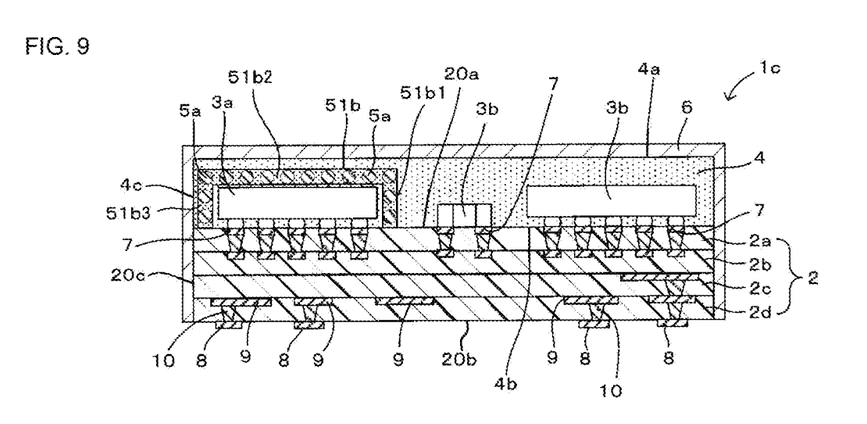
FIG. 9 is a diagram illustrating a modification of the shield member illustrated in FIG. 7.

The shape of the second shield member 51b can be changed as appropriate. For example, as illustrated in FIG. 9, the second shield member 51b may further include, in addition to the first portion 51b1 and the second portion 51b2, a third portion 51b3 extending from the end portion (the end portion on the opposite side from the end portion connected to the first portion 51b1) of the second portion 51b2 toward the upper surface 20a of the multilayer wiring board 2.

In the shield film 6, a film thickness of a portion covering the side surface 4c of the sealing resin layer 4 is thinner than a film thickness of a portion covering the upper surface 4a of the sealing resin layer 4. Therefore, the shield film 6 has, in comparison with the portion covering the upper surface 4a of the sealing resin layer 4, poorer shield characteristics of the portion covering the side surface 4c of the sealing resin layer 4. Accordingly, by forming the third portion 51b3 as in the present example, it is possible to improve the function of blocking noise from the side surface 4c of the sealing resin layer 4.

Fourth Embodiment

A high-frequency module 1d according to a fourth embodiment of the present disclosure will be described with reference to FIG. 10 to FIG. 12. Note that FIG. 10 is a cross-sectional view of the high-frequency module 1d, that is, the cross-sectional view taken along a line D-D in FIG. 11 when viewed in the arrow direction, FIG. 11 is a plan view of the high-frequency module 1d in a state in which the sealing resin layer 4 and the shield film 6 are removed, and FIG. 12 is a development view of a shield member 52.

Figure 10:
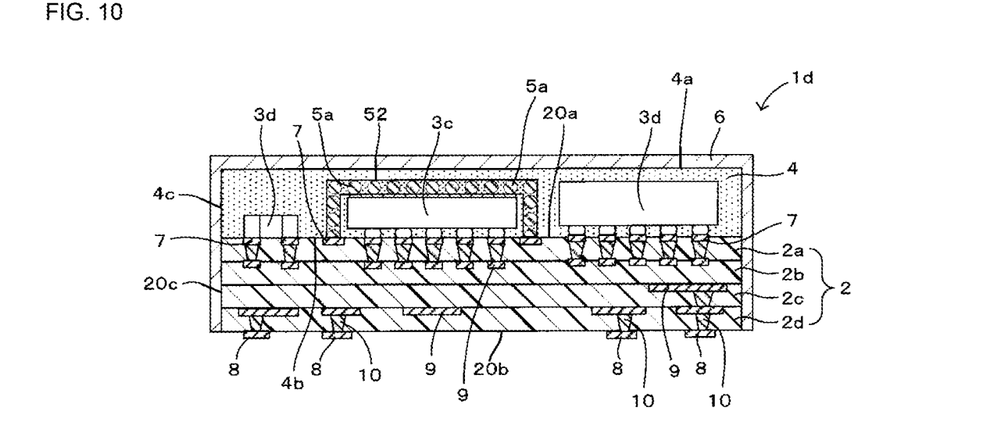
FIG. 10 is a cross-sectional view of a high-frequency module according to a fourth embodiment of the present disclosure.
Figure 11:
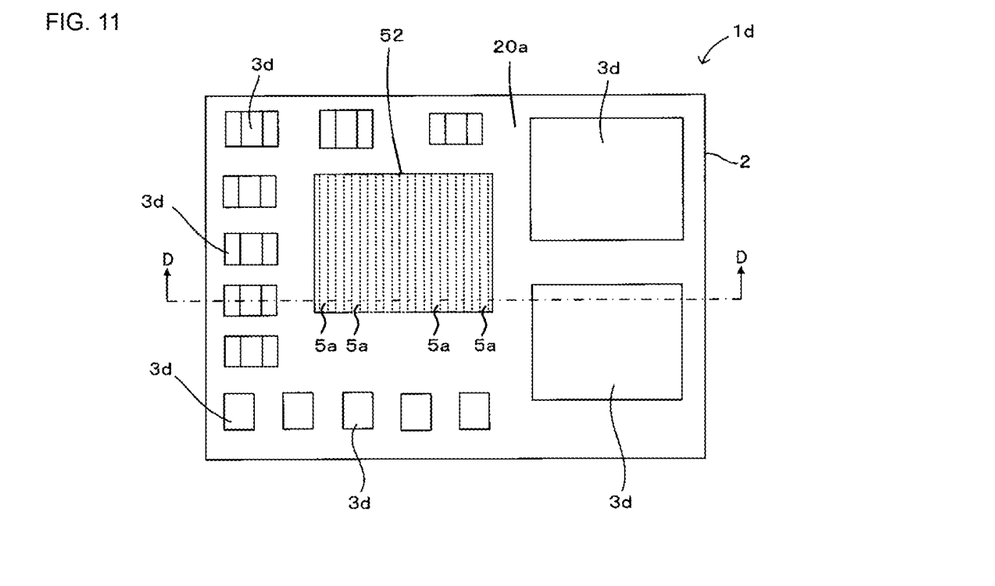
FIG. 11 is a plan view of the high-frequency module illustrated in FIG. 10 in a state in which a sealing resin layer and a shield film are removed.
Figure 12:
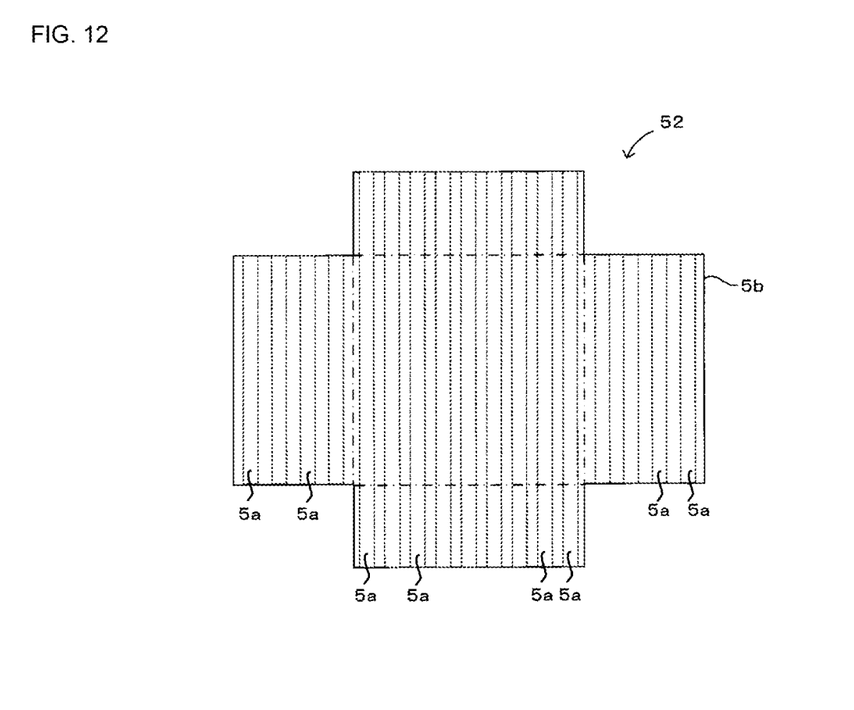
FIG. 12 is a development view of the shield member illustrated in FIG. 10.

The high-frequency module 1d according to this embodiment differs from the high-frequency module 1b according to the second embodiment described with reference to FIG. 5 and FIG. 6 in that the shield member has a different configuration as illustrated in FIG. 10 and FIG. 11. The rest of the configuration is the same as that of the high-frequency module 1b according to the second embodiment, and the description thereof will be omitted by using the same reference numerals.

In this case, the shield member 52 is formed in a box shape, and is mounted at a position covering the component 3c at the center. Furthermore, the shield member 52 has a height in the thickness direction of the sealing resin layer 4 less than the thickness of the sealing resin layer 4, and the shield member 52 is embedded in the sealing resin layer 4.

As a method for manufacturing the shield member 52, for example, the plurality of metal pins 5a arranged in parallel at predetermined intervals is fixed by the resin molded portion 5b and is formed in a flat plate shape. At this time, the resin molded portion 5b is not completely cured and made to be in a B-stage state. Next, as illustrated in FIG. 12, the compound of the metal pins 5a and the resin molded portion 5b formed in the flat plate shape is cut into a shape such as that two orthogonal strips are synthesized. There is a method in which this is bent at positions indicated by the dot-dash lines in FIG. 12, and the resin molded portion 5b is finally completely cured.

According to this configuration, since the upper side of the component 3c is also covered with the shield member 52, the shield function for the component 3c is further improved.

Fifth Embodiment

A high-frequency module 1e according to a fifth embodiment of the present disclosure will be described with reference to FIG. 13. Note that FIG. 13 is a cross-sectional view of the high-frequency module 1e.

Figure 13:
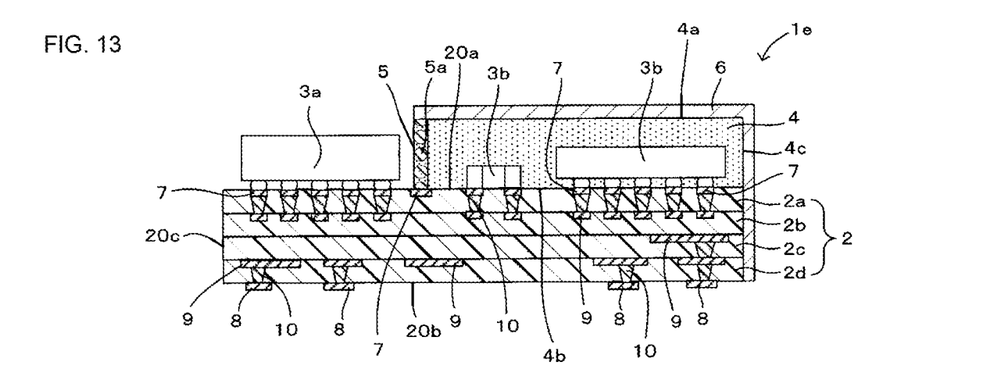
FIG. 13 is a cross-sectional view of a high-frequency module according to a fifth embodiment of the present disclosure.

The high-frequency module 1e according to this embodiment differs from the high-frequency module 1a according to the first embodiment described with reference to FIG. 1 to FIG. 3C in that the sealing resin layer 4 has a different sealing area and the shield film 6 has a different covering area as illustrated in FIG. 13. The rest of the configuration is the same as that of the high-frequency module 1a according to the first embodiment, and the description thereof will be omitted by using the same reference numerals.

In this case, the upper surface 20a of the multilayer wiring board 2 is divided into a mounting area of the component 3a and a mounting area of the component 3b by using the shield member 5 as a boundary, the mounting area of the component 3a is not sealed with the sealing resin layer 4 and the mounting area of the component 3b is sealed with the sealing resin layer 4.

The shield film 6 covers the upper surface 4a of the sealing resin layer 4, and does not cover a portion where the shield member 5 is arranged and covers the other region, of the side surface 4c of the sealing resin layer 4.

When the shield film 6 is formed by a sputtering method or the like, a film thickness of the portion covering the side surface 4c of the sealing resin layer 4 is less than a film thickness of the portion covering the upper surface 4a. Accordingly, the side surface 4c of the sealing resin layer 4 has poorer shielding characteristics than those of the upper surface 4a. Accordingly, in a case where the shield member 5 is not provided in this embodiment, there is a risk that the shield function between the component 3a and the component 3b will decrease. Therefore, as in this embodiment, by arranging the shield member 5 in place of the shield film 6, it is possible to prevent the shield function between the component 3a and the other component 3b from decreasing.

Note that the present disclosure is not intended to be limited to the above-described embodiments, and many changes aside from the contents described above can be made without departing from the essential spirit of the present disclosure. For example, the configurations of the embodiments and the modifications described above may be combined.

Furthermore, in the first, second, fourth, and fifth embodiments described above, the mounting electrode 7 for the shield members 5, 50, and 52 is provided over the entire region in which the shield members 5, 50, and 52 are each in contact with the upper surface 20a of the multilayer wiring board 2, but the mounting electrode 7 for the shield members 5, 50, and 52 may be provided only a part of the region in which the shield members 5, 50, and 52 are each in contact with the upper surface 20a of the multilayer wiring board 2. With this configuration, the degree of freedom in design of wiring of the upper surface 20a of the multilayer wiring board 2 is improved.

Furthermore, in the fourth embodiment, the configuration in which the shield member 52 covers only the one component 3c has been described, but the shield member 52 may be used as a member for shielding a predetermined area, such as covering a plurality of components together.

Furthermore, in the embodiments described above, the case where the shield members 5, 50, 51a, 51b, and 52 each have the plurality of metal pins 5a has been described, but the shield member may be formed, only by mounting one metal pin so as to be horizontally placed (mounting in a direction in which the length direction is parallel to the upper surface 20a of the multilayer wiring board 2).

Furthermore, in the embodiments described above, the shield film 6 may not be provided. In this case, the shield members 5, 50, 51a, 51b, and 52 may each be connected to the ground electrode (inner wiring electrode 9) of the multilayer wiring board 2.

The present disclosure can be broadly applied in various high-frequency modules including a shield between components.

1a to 1e HIGH-FREQUENCY MODULE
2 MULTILAYER WIRING BOARD (WIRING BOARD)
3a to 3d COMPONENT
4 SEALING RESIN LAYER
5, 50, 51a, 51b, 52 SHIELD MEMBER
5a METAL PIN
5b RESIN MOLDED PORTION
6 SHIELD FILM

The invention claimed is:

1. A high-frequency module comprising:
a wiring board;
a first component and a second component mounted on a main surface of the wiring board;
a shield member arranged between the first component and the second component, wherein the shield member includes one or more metal pins, each of the one or more metal pins having a predominant length and being arranged such that a direction of the predominant length is substantially parallel to the main surface of the wiring board;
a sealing resin layer including a contact surface making contact with the main surface of the wiring board, an opposing surface opposing to the contact surface, and a side surface for connecting end edges of the contact surface and the opposing surface to each other, wherein the sealing resin layer seals the first component and the second component; and
a shield film for covering at least the opposing surface and the side surface of the sealing resin layer,
wherein the one or more metal pins include a plurality of first metal pins,
wherein each first metal pin is arranged so as to overlap with another first metal pin when viewed from a direction perpendicular to the main surface of the wiring board, and
wherein a first metal pin among the plurality of first metal pins, arranged at a farthest position from the main surface of the wiring board in a direction perpendicular to the main surface of the wiring board, is exposed from the opposing surface of the sealing resin layer and connected to the shield film.

2. The high-frequency module according to claim 1, wherein the shield member is arranged so as to surround at least one of the first component and the second component.

3. The high-frequency module according to claim 1,
wherein an end portion of each of the plurality of first metal pins is exposed to the side surface of the sealing resin layer and connected to the shield film.

4. The high-frequency module according to claim 2,
wherein an end portion of each of the plurality of first metal pins is exposed to the side surface of the sealing resin layer and connected to the shield film.

5. A high-frequency module comprising:
a wiring board;
a first component and a second component mounted on a main surface of the wiring board; and
a shield member arranged between the first component and the second component, wherein the shield member includes one or more metal pins, each of the one or more metal pins having a predominant length and being arranged such that a direction of the predominant length is substantially parallel to the main surface of the wiring board,
wherein the one or more metal pins include a plurality of first metal pins,
wherein each first metal pin is arranged so as to overlap with another first metal pin when viewed from a direction perpendicular to the main surface of the wiring board, and
wherein the one or more metal pins further includes a plurality of second metal pins, each second metal pin being spaced apart from the first component and arranged at a position overlapping with the first component when viewed from the direction perpendicular to the main surface.

6. The high-frequency module according to claim 5, the high-frequency module further comprising:
a sealing resin layer including a contact surface making contact with the main surface of the wiring board, an opposing surface opposing to the contact surface, and a side surface for connecting end edges of the contact surface and the opposing surface to each other, wherein the sealing resin layer seals one of the first component and the second component; and
a shield film for covering at least the opposing surface and the side surface of the sealing resin layer.

7. The high-frequency module according to claim 5,
wherein the shield member is arranged so as to surround at least one of the first component and the second component.

8. The high-frequency module according to claim 5,
wherein the shield member is comprised of a first shield member arranged between the first component and the second component, and a second shield member provided so as to cover the first component.

9. The high-frequency module according to claim 5,
wherein the shield member has a box shape, and is arranged at a position covering the first component.

10. The high-frequency module according to claim 5,
wherein an end portion of each of the plurality of first metal pins is exposed to the side surface of the sealing resin layer and connected to the shield film.

11. A high-frequency module comprising:
a wiring board;
a first component and a second component mounted on a main surface of the wiring board;
a shield member arranged between the first component and the second component;
a sealing resin layer including a contact surface making contact with the main surface of the wiring board, an opposing surface opposing to the contact surface, and a side surface for connecting end edges of the contact surface and the opposing surface to each other, wherein the sealing layer seals the first component and the second component; and
a shield film for covering at least the opposing surface and the side surface of the sealing resin layer,
wherein the shield member includes one or more metal pins, each of the one or more metal pins comprising an elongated body that is predominantly elongated in a direction substantially parallel to the main surface of the wiring board,
wherein the one or more metal pins include a plurality of first metal pins,
wherein each first metal pin is arranged so as to overlap with another first metal pin when viewed from a direction perpendicular to the main surface of the wiring board, and
wherein an end portion of each of the plurality of first metal pins is exposed to the side surface of the sealing resin layer and connected to the shield film.

12. The high-frequency module according to claim 11,
wherein the one or more metal pins further includes a plurality of second metal pins, each second metal pin being spaced apart from the first component and arranged at a position overlapping with the first component when viewed from the direction perpendicular to the main surface.

13. The high-frequency module according to claim 11,
wherein the shield member is arranged so as to surround at least one of the first component and the second component.

14. The high-frequency module according to claim 11,
wherein the shield member is comprised of a first shield member arranged between the first component and the second component, and a second shield member provided so as to cover the first component.

15. The high-frequency module according to claim 11,
wherein the shield member has a box shape, and is arranged at a position covering the first component.

16. The high-frequency module according to claim 11,
wherein the shield member is provided in a plate shape by the plurality of first metal pins being covered with a resin.

* * * * *

UNITED STATES PATENT AND TRADEMARK OFFICE
CERTIFICATE OF CORRECTION

PATENT NO. : 11,602,089 B2
APPLICATION NO. : 16/878181
DATED : March 7, 2023
INVENTOR(S) : Yoshihito Otsubo et al.

It is certified that error appears in the above-identified patent and that said Letters Patent is hereby corrected as shown below:

In the Specification

Column 9, Line 47, "length 1." should read -- length l. --.

Signed and Sealed this
Second Day of January, 2024

Katherine Kelly Vidal
*Director of the United States Patent and Trademark Office*